(12) United States Patent
Zou et al.

(10) Patent No.: US 12,113,095 B2
(45) Date of Patent: Oct. 8, 2024

(54) PLANAR INDUCTOR AND SEMICONDUCTOR CHIP

(71) Applicant: Huawei Technologies Co., Ltd., Shenzhen (CN)

(72) Inventors: Xiaowei Zou, Shenzhen (CN); Chengbo Qiu, Shanghai (CN); Haisheng Lu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 619 days.

(21) Appl. No.: 17/205,805

(22) Filed: Mar. 18, 2021

(65) Prior Publication Data
US 2021/0210591 A1 Jul. 8, 2021

Related U.S. Application Data

(63) Continuation of application No. PCT/CN2018/106884, filed on Sep. 21, 2018.

(51) Int. Cl.
*H01F 27/28* (2006.01)
*H01F 5/00* (2006.01)
*H01L 49/02* (2006.01)

(52) U.S. Cl.
CPC .............. *H01L 28/10* (2013.01); *H01F 5/003* (2013.01); *H01F 27/28* (2013.01)

(58) Field of Classification Search
CPC .............. H01L 28/10; H01L 23/5227; H01F 2017/0073; H01F 2017/0086; H01F 17/0006; H01F 17/0013
See application file for complete search history.

(56) References Cited

U.S. PATENT DOCUMENTS

| 6,008,102 A | 12/1999 | Alford et al. |
| 6,529,720 B1 | 3/2003 | Jovenin et al. |
| 2003/0122648 A1 | 7/2003 | Ou et al. |
| 2004/0140878 A1* | 7/2004 | Heima ............... H01F 17/0013 257/E27.046 |
| 2006/0220737 A1 | 10/2006 | Sanderson |
| 2006/0220778 A1* | 10/2006 | Marques .................. H04R 3/00 336/225 |
| 2008/0084255 A1 | 4/2008 | El Rai et al. |

(Continued)

FOREIGN PATENT DOCUMENTS

| CN | 101459178 A | 6/2009 | |
| CN | 101795144 A * | 8/2010 | ............. H03B 19/00 |

(Continued)

*Primary Examiner* — Tuyen T Nguyen
(74) *Attorney, Agent, or Firm* — Slater Matsil, LLP (57) ABSTRACT

This application discloses a planar inductor. The planar inductor includes a first inductor module and a second inductor module that are connected in parallel. A direction of a magnetic line of the first inductor module is opposite to a direction of a magnetic line of the second inductor module, so that the magnetic lines can form a self-close loop in the planar inductor, and impact of a far magnetic field generated by the inductor on the outside, especially a nearby inductor, can be greatly reduced, thereby reducing crosstalk between the inductors, that is, reducing a phase noise, and increasing a Q value of the inductor. In addition, this application further provides a semiconductor chip that includes the planar inductor.

14 Claims, 3 Drawing Sheets

(56) References Cited

U.S. PATENT DOCUMENTS

| | | |
|---|---|---|
| 2010/0225407 A1 | 9/2010 | Goyal et al. |
| 2011/0156854 A1 | 6/2011 | Lee |
| 2016/0172310 A1 | 6/2016 | Zhai |
| 2016/0351309 A1 | 12/2016 | Caffee |
| 2017/0179881 A1 | 6/2017 | Caffee |

FOREIGN PATENT DOCUMENTS

| | | |
|---|---|---|
| CN | 103474414 A | 12/2013 |
| CN | 106206537 A | 12/2016 |
| CN | 107017842 A | 8/2017 |
| CN | 107492547 A | 12/2017 |
| EP | 3171512 A1 | 5/2017 |
| WO | 9949513 A1 | 9/1999 |
| WO | 02080279 A1 | 10/2002 |
| WO | 2006105184 A1 | 10/2006 |

* cited by examiner

FIG. 8

PLANAR INDUCTOR AND SEMICONDUCTOR CHIP

CROSS-REFERENCE TO RELATED APPLICATIONS

This application is a continuation of International Application No. PCT/CN2018/106884, filed on Sep. 21, 2018, the disclosure of which is hereby incorporated by reference in its entirety.

TECHNICAL FIELD

This application relates to the field of semiconductor devices, and in particular, to a planar inductor and a semiconductor chip that includes the planar inductor.

BACKGROUND

With rapid progress and development of the semiconductor industry, integration of various devices such as a resistor, a capacitor, and an inductor into a semiconductor process product becomes an inevitable trend.

As a key element in a radio frequency integrated circuit, a planar inductor is difficult to design and master in the circuit. A performance parameter of the planar inductor directly affects performance of the radio frequency integrated circuit. The planar inductor features low costs, easy integration, low noise, and low power consumption, and more importantly, is compatible with current CMOS processes.

A conventional planar inductor is usually square or octagonal because of planar process manufacturing. Such an inductor structure is relatively easy to achieve better performance, such as an area and a quality factor. However, in some applications, such as clock design or voltage-controlled oscillator (VCO) design, when a plurality of channels work at the same time, this type of inductor structure easily generates crosstalk, which forms a so-called phase noise.

SUMMARY

In view of this, a first aspect of this application provides a planar inductor, so as to reduce an inductance value of the planar inductor, reduce a phase noise, and increase a Q value of the inductor.

Based on the first aspect of this application, a second aspect of this application provides a semiconductor chip.

To resolve the foregoing technical problem, the following technical solutions are used in this application:

A first aspect of this application provides an inductor that is disposed in a semiconductor chip and that includes a signal input end, a signal output end, and a first inductor module and a second inductor module that are disposed at a metal layer of the semiconductor chip. A cross-sectional shape of each of the first inductor module and the second inductor module at the metal layer is a closed pattern with an opening, and the closed patterns formed by the first inductor module and the second inductor module are fastened to each other. The first inductor module and the second inductor module are connected in parallel between the signal input end and the signal output end, a direction of a magnetic line in the first inductor module is opposite to a direction of a magnetic line in the second inductor module, and a self-close loop is formed in the inductor. In the inductor, the direction of the magnetic line of the first inductor module is opposite to the direction of the magnetic line of the second inductor module, so that the magnetic lines can form a self-close loop in the planar inductor, and impact of a far magnetic field generated by the inductor on the outside, especially a nearby inductor, can be greatly reduced, thereby reducing crosstalk between the inductors, that is, reducing a phase noise, and increasing a Q value of the inductor.

Based on the first aspect of this application, in a first possible implementation, the first inductor module and the second inductor module are distributed on different sides of the signal input end or the signal output end. In this possible implementation, the impact of the far magnetic field generated by the inductor on the outside, especially by a nearby inductor, can be further reduced, thereby further reducing the crosstalk between the inductors.

Based on the first possible implementation of the first aspect of this application, in a second possible implementation, the first inductor module and the second inductor module are distributed on two sides of a connection line between the signal input end and the signal output end. In this possible implementation, the impact of the far magnetic field generated by the inductor on the outside, especially by a nearby inductor, can be further reduced, thereby further reducing the crosstalk between the inductors.

Based on the second possible implementation of the first aspect of this application, in a third possible implementation, the first inductor module and the second inductor module are symmetrically distributed on the two sides of the connection line between the signal input end and the signal output end. In this possible implementation, the impact of the far magnetic field generated by the inductor on the outside, especially by a nearby inductor, can be further reduced, thereby further reducing the crosstalk between the inductors.

Based on any one of the first aspect of this application and the foregoing possible implementations of the first aspect, in a fourth possible implementation, shapes and/or sizes of the first inductor module and the second inductor module are the same. In this possible implementation, the impact of the far magnetic field generated by the inductor on the outside, especially by a nearby inductor, can be further reduced, thereby further reducing the crosstalk between the inductors.

Based on any one of the first aspect of this application and the foregoing possible implementations of the first aspect, in a fifth possible implementation, the closed pattern is a quadrilateral, an octagon, or a circle.

Based on any one of the first aspect of this application and the foregoing possible implementations of the first aspect, in a sixth possible implementation, at least one of the first inductor module or the second inductor module includes at least one metal layer, and a cross-sectional shape of the metal layer is a closed pattern with an opening.

Based on the sixth possible implementation of the first aspect of this application, in a seventh possible implementation, at least one of the first inductor module or the second inductor module includes two or more the metal layers. In this possible implementation, an inductance value and a Q value of the inductor can be increased.

Based on the seventh possible implementation of the first aspect of this application, in an eighth possible implementation, two adjacent metal layers are electrically connected to each other by using a conductive pillar. In this possible implementation, a parasitic resistance of the inductor can be reduced.

Based on the seventh possible implementation of the first aspect of this application, in a ninth possible implementation, the metal layer is one or more metal layers closest to a top layer of the semiconductor chip. In this possible implementation, a resistance of the inductor can be reduced.

Based on any one of the sixth to ninth possible implementations of the first aspect of this application, in a tenth possible implementation, a material of the metal layer is aluminum or an aluminum-copper alloy.

A second aspect of this application provides an inductor, where the inductor includes a signal input end, a signal output end, and a pair of metal strips connected in parallel between the signal input end and the signal output end, the pair of metal strips are distributed on two sides of a connection line between the signal input end and the signal output end, and middle segments of the pair of metal strips protrude to two sides by using the connection line as a center to form arc shapes. In the inductor, middle segments of a pair of metal strips protrude to two sides by using the connection line as a center to form arc shapes. In this way, a direction of a magnetic line of one metal strip in the pair of metal strips is opposite to a direction of a magnetic line of the other metal strip, so that the magnetic lines can form a self-close loop in the planar inductor, and impact of a far magnetic field generated by the inductor on the outside, especially a nearby inductor, can be greatly reduced, thereby reducing crosstalk between the inductors, that is, reducing a phase noise, and increasing a Q value of the inductor.

Based on the second aspect of this application, in a first possible implementation, the pair of metal strips protrude to form a same shape and/or a same size. In this possible implementation, the impact of the far magnetic field generated by the inductor on the outside, especially by a nearby inductor, can be further reduced, thereby further reducing the crosstalk between the inductors.

Based on the first possible implementation of the second aspect of this application, in a second possible implementation, at least one metal strip in the pair of metal strips includes at least one metal layer.

Based on the second possible implementation of the second aspect of this application, in a third possible implementation, at least one metal strip in the pair of metal strips includes two or more metal layers. In this possible implementation, an inductance value and a Q value of the inductor can be further increased.

Based on the third possible implementation of the second aspect of this application, in a fourth possible implementation, two adjacent metal layers are electrically connected to each other by using a conductive pillar. In this possible implementation, a parasitic resistance of the inductor can be reduced.

A third aspect of this application provides a semiconductor chip, including a substrate and an inductor on the substrate, where the inductor is the inductor according to any one of the possible implementations of the first aspect or the second aspect. The semiconductor chip has an effect corresponding to any one of the possible implementations of the first aspect or the second aspect.

Compared with the prior art, this application has the following beneficial effects.

It may be learned from the foregoing technical solutions that, the planar inductor provided in this application includes the first inductor module and the second inductor module that are connected in parallel, where the direction of the magnetic line of the first inductor module is opposite to the direction of the magnetic line of the second inductor module, so that the magnetic lines can form a self-close loop in the planar inductor, and the impact of the far magnetic field generated by the inductor on the outside, especially a nearby inductor, can be greatly reduced, thereby reducing the crosstalk between the inductors, that is, reducing the phase noise, and increasing the Q value of the inductor.

BRIEF DESCRIPTION OF THE DRAWINGS

To clearly understand specific implementations of this application, the following briefly describes accompanying drawings used for describing the specific implementations of this application. It is clearly that the accompanying drawings show merely some embodiments of this application.

DETAILED DESCRIPTION OF ILLUSTRATIVE EMBODIMENTS

Before specific implementations of this application are described, an inductor-related technical term used in the specific implementations of this application is first described.

Q value: is short for a quality factor of an inductor. Q value is defined as a ratio of energy stored in the inductor to an energy loss per oscillation period. A higher quality factor Q value of the inductor indicates a lower inductor loss and higher efficiency.

The following describes the specific implementations of this application.

It can be learned from the background part that, when a plurality of channels work at the same time, a conventional planar inductor easily generates crosstalk, which forms a so-called phase noise.

To reduce a phase noise and increase a Q value of an inductor, embodiments of this application provide a planar inductor. The planar inductor is disposed in a semiconductor chip, and includes a first inductor module and a second inductor module that are connected in parallel. A direction of a magnetic line of the first inductor module is opposite to a direction of a magnetic line of the second inductor module, so that the magnetic lines can form a self-close loop in the planar inductor, and impact of a far magnetic field generated by the inductor on the outside, especially a nearby inductor, can be greatly reduced, thereby reducing crosstalk between the inductors, that is, reducing the phase noise, and increasing the Q value of the inductor.

To understand the specific implementations of this application more clearly, the following describes in detail the planar inductor provided in this application with reference to the accompanying drawings.

It should be noted that the planar inductor provided in this application is disposed in a semiconductor chip.

Figure 1:
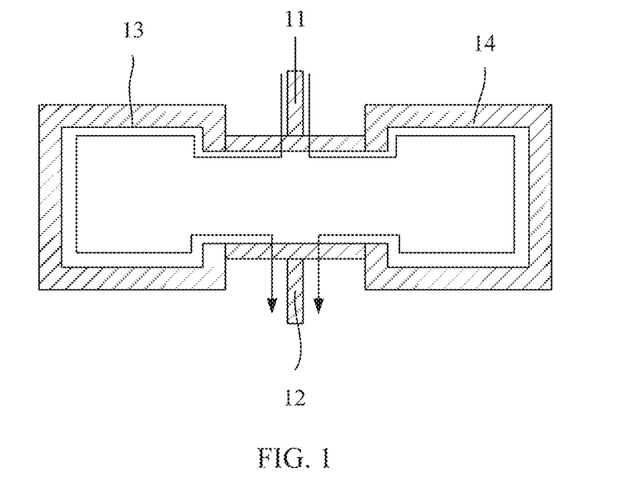
FIG. 1 is a schematic top view of a structure of a planar inductor according to an embodiment of this application.

Referring to FIG. 1, a planar inductor provided in an embodiment of this application includes:

a signal input end 11, a signal output end 12, and a first inductor module 13 and a second inductor module 14 that are disposed on a metal layer of a semiconductor chip.

Cross-sectional shapes of the first inductor module 13 and the second inductor module 14 on the metal layer are closed patterns with an opening, and the closed patterns formed by the first inductor module 13 and the second inductor module 14 are mutually fastened.

The signal input end 11 is connected to one end of the first inductor module 13 and one end of the second inductor module 14, and the signal output end 12 is connected to the other end of the first inductor module 13 and the other end of the second inductor module 14. Therefore, the first inductor module 13 and the second inductor module 14 are connected in parallel between the signal input end 11 and the signal output end 12, and the first inductor module 13 and the second inductor module 14 are distributed on two sides of a connection line between the signal input end 11 and the signal output end 12. Specifically, in FIG. 1, the first inductor module 13 is distributed on the left side of the connection line between the signal input end 11 and the signal output end 12, and the second inductor module 14 is distributed on the right side of the connection line between the signal input end 11 and the signal output end 12.

Based on the foregoing planar inductor structure, a current flows in from the signal input end 11, passes through the first inductor module 13 and the second inductor module 14 separately, and finally flows out from the signal output end 12. A direction of the current in the first inductor module 13 is a counterclockwise direction shown by an arrow in FIG. 1, and a direction of the current in the second inductor module 14 is a clockwise direction shown by an arrow in FIG. 1. It can be seen from FIG. 1 that the direction of the current in the first inductor module 13 is opposite to the direction of the current in the second inductor module 14. Therefore, a direction of a magnetic line generated by the first inductor module 13 is also opposite to a direction of a magnetic line generated by the second inductor module 14. Therefore, the magnetic line generated by the first inductor module 13 and the magnetic line generated by the second inductor module 14 can be offset from each other, so that the magnetic lines can form a self-close loop in the planar inductor. Therefore, impact of a far magnetic field generated by the inductor on the outside, especially a nearby inductor, can be greatly reduced, thereby reducing crosstalk between the inductors, that is, reducing a phase noise, and increasing a Q value of the inductor.

It should be noted that, in this embodiment of this application, the first inductor module 13 and the second inductor module 14 are not limited to being arranged on both sides of the connection line between the signal input end 11 and the signal output end 12, as described above. A position relationship between the two inductor modules is applicable provided that the directions of the magnetic lines inside the two inductor modules are opposite to each other, and the magnetic lines can form a self-close loop in the inductor.

Therefore, in an extended embodiment of this application, the first inductor module 13 and the second inductor module 14 may be distributed on different sides of the signal input end 11, or may be distributed on different sides of the signal output end 12. Specifically, for example, the signal input end 11 is used as an origin, and there is an included angle between a connection line between the first inductor module 13 and the signal input end 11, and a connection line between the second inductor module 14 and the signal input end 11. In a more specific example, the included angle may be 0° to 360°, and does not include endpoint values.

In addition, shapes of the first inductor module 13 and the second inductor module 14 may be the same or different. In addition, sizes of the first inductor module 13 and the second inductor module 14 may be the same or different. The first inductor module 13 and the second inductor module 14 that have a same shape and a same size are more conducive to forming a self-close loop by the magnetic lines in the planar inductor.

In an optional implementation of this application, to better enable the magnetic line generated by the first inductor module 13 and the magnetic line generated by the second inductor module 14 to form a self-close loop in the inductor, and further reduce impact of the far magnetic field generated by the inductor on the outside, especially a nearby inductor, thereby further reducing crosstalk between the inductors, the first inductor module 13 and the second inductor module 14 have a same shape and a same size, and may be symmetrically distributed on two sides of the connection line between the signal input end 11 and the signal output end 12. In this way, the first inductor module 13 and the second inductor module 14 form a "butterfly-like" inductor. In the "butterfly-like" inductor, the magnetic line generated by the first inductor module 13 and the magnetic line generated by the second inductor module 14 can be offset from each other, so that the magnetic lines can form a self-close loop in the planar inductor. Therefore, impact of the far magnetic field generated by the inductor on the outside, especially a nearby inductor, can be greatly reduced, thereby reducing crosstalk between the inductors, that is, reducing the phase noise, and increasing the Q value of the inductor.

In FIG. 1, a cross-sectional shape of each of the first inductor module 13 and the second inductor module 14 is described by using an open quadrilateral as an example. Actually, as an extension of this embodiment of this application, the cross-sectional shape of each of the first inductor module 13 and the second inductor module 14 may be another closed pattern. For example, the closed image may be a triangle, a polygon, or a circle. For example, the polygon may be an octagon or a hexagon.

Figure 2:
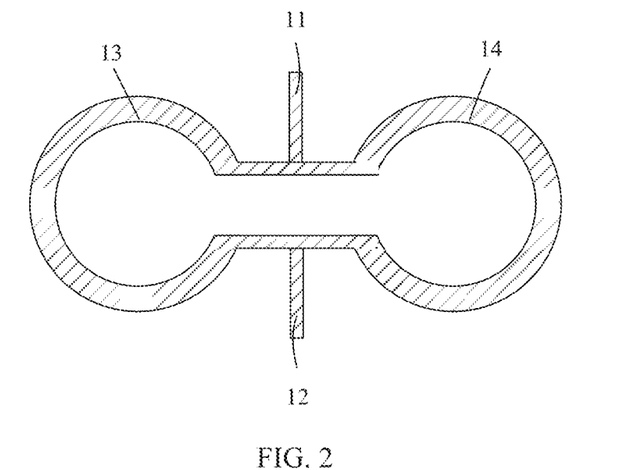
FIG. 2 is a schematic top view of another structure of a planar inductor according to an embodiment of this application.

When the cross-sectional shape of each of the first inductor module 13 and the second inductor module 14 is an open circular, a top view of the planar inductor is shown in FIG. 2.

Figure 3:
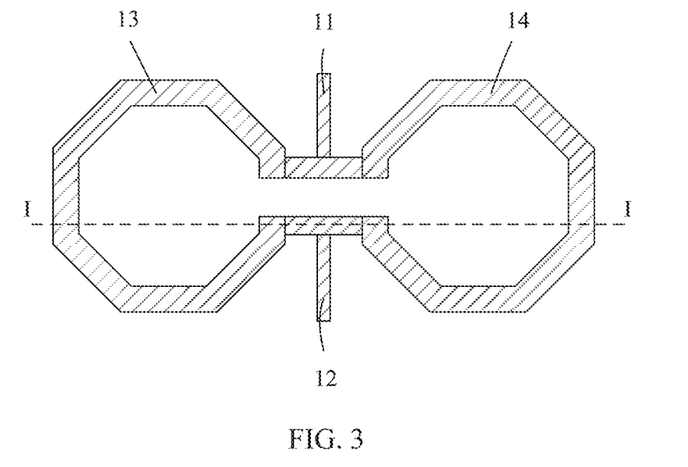
FIG. 3 is a schematic top view of still another structure of a planar inductor according to an embodiment of this application.

When the cross-sectional shape of each of the first inductor module 13 and the second inductor module 14 is an open octagon, a top view of the planar inductor is shown in FIG. 3.

It should be noted that, in this embodiment of the present invention, that the directions of the magnetic lines are opposite does not necessarily require that the directions of the magnetic lines are different by 180 degrees, but means that based on a plane of a circuit or a semiconductor chip in which the inductor is located, the directions of the magnetic lines of the two inductor modules are transmitted toward two sides of the plane, so that the magnetic lines of the two inductor modules can be completely or partially offset. Certainly, an offset scenario in which the magnetic lines of the two inductor modules have minimum impact on the circuit in the plane is that transmit directions of the two magnetic lines are different by 180 degrees, which is only a theoretical value.

In addition, the planar inductor provided in this embodiment of this application may be disposed in a semiconductor chip, so that the planar inductor can be formed on a substrate by using a semiconductor process. It should be noted that in this embodiment of this application, the planar inductor may be made of a metal layer formed on the substrate. The metal layer is a patterned metal layer, and a pattern of the patterned metal layer is a closed pattern with an opening. For example, the closed pattern may be a polygon or a circle.

In an optional implementation of this application, the planar inductor may include one metal layer.

Figure 4:
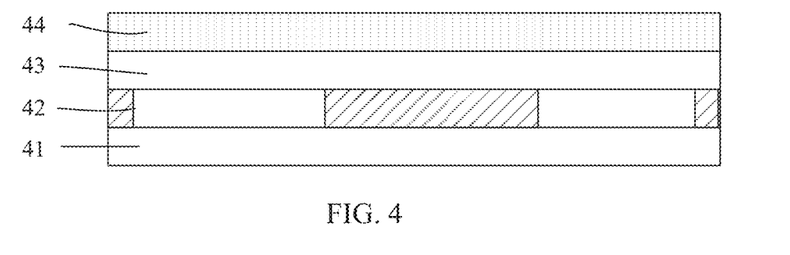
FIG. 4 is a schematic cross-sectional diagram of a structure of a planar inductor according to an embodiment of this application.

FIG. 4 is a schematic diagram of a cross-sectional structure of a planar inductor including one metal layer. The cross-sectional structure is a cross-sectional view along an I-I direction in FIG. 3. FIG. 4 is a cross-sectional view of a planar inductor, and the planar inductor includes:

a first dielectric layer 41;

a metal layer 42 located above the first dielectric layer 41, where the metal layer 42 is a patterned metal layer structure; a pattern of the patterned metal layer structure may be an open closed pattern; and for example, the closed pattern may be a polygon or a circle; and a second dielectric layer 43 that covers the metal layer 42.

It should be noted that an inductance value and a Q value of the inductor are related to a size of a metal layer used to form the inductor. Therefore, when the inductor is designed, a size of a metal layer that matches the inductor, or even a quantity of metal layers needs to be designed based on the induction value and the Q value of the inductor.

As an example of the foregoing optional implementation, to protect the semiconductor chip from water, and enable the semiconductor chip to have better stress buffer performance, the foregoing planar inductor may further include:

a passivation layer 44 that covers a top of the second dielectric layer 43.

As another example of this application, the passivation layer that covers the top of the second dielectric layer 43 may be at least one layer. To be specific, the passivation layer 44 may be one layer structure, or may be a multi-layer structure.

For example, a forming process of the planar inductor shown in FIG. 4 may include the following steps:

A1: Form the first dielectric layer 41 on a substrate.

A2: Form the metal layer 42 of a specific thickness on the first dielectric layer 41, where the metal layer is a patterned structure. A pattern of the patterned metal layer structure may be an open closed pattern. For example, the closed pattern may be a polygon or a circle.

A3: Form the second dielectric layer 43 above the patterned metal layer 42, and fill a dielectric material that forms the second dielectric layer 43 into a gap of the metal layer 42.

A4: Form the passivation layer 44 above the second dielectric layer 43.

It should be noted that, in the semiconductor chip, to reduce interaction between the planar inductor and the substrate to avoid forming a parasitic capacitance, in an optional embodiment of this application, the planar inductor is disposed at a top layer of the semiconductor chip. In addition, in a structure of the semiconductor chip, a metal layer that is usually located at the top of the chip is relatively thick, and a relatively thick metal layer helps reduce a resistance in the inductor. In this way, in this embodiment of this application, the metal layer 42 may be a metal layer closest to the top layer of the semiconductor chip. In addition, the metal layer 42 may alternatively be a redistribution layer (RDL layer) in the semiconductor chip. As a specific example, a material of the metal layer 42 may be aluminum or an aluminum-copper alloy. In addition, a thickness of the metal layer 42 is related to a semiconductor process.

Figure 5:
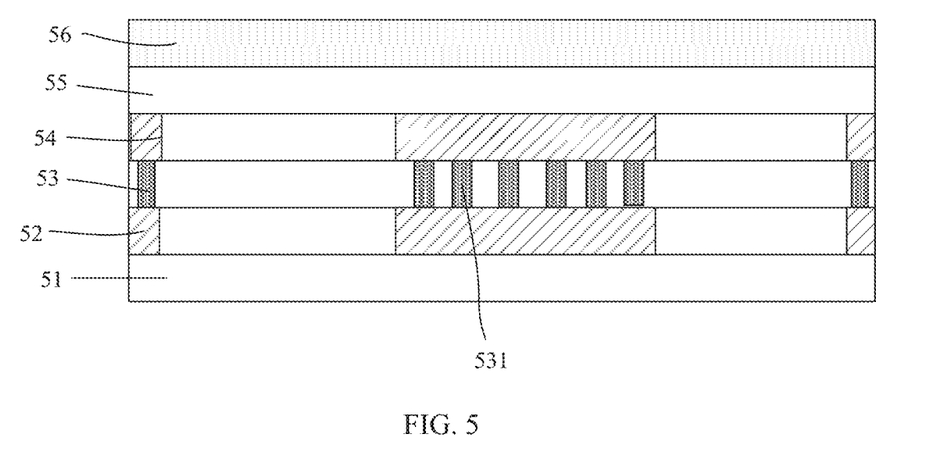
FIG. 5 is a schematic cross-sectional diagram of another structure of a planar inductor according to an embodiment of this application.

In another optional implementation of this application, the planar inductor may include two metal layers. FIG. 5 is a cross-sectional view of a planar inductor including two metal layers. The cross-sectional structural diagram is a cross-sectional view along an I-I direction in FIG. 3. In the cross-sectional view of the planar inductor shown in FIG. 5, the planar inductor includes:

a first dielectric layer 51;

a first metal layer 52 located above the first dielectric layer 51, where the first metal layer 52 is a patterned metal layer structure; a pattern of the patterned metal layer structure may be an open closed pattern; and for example, the closed pattern may be a polygon or a circle;

a second dielectric layer 53 that covers the first metal layer 52, where a conductive pillar 531 that runs through upper and lower surfaces of the second dielectric layer 53 is disposed at the second dielectric layer 53;

a second metal layer 54 that covers the second dielectric layer 53, where the second metal layer 54 is a patterned metal layer structure, and the second metal layer 54 is electrically connected to the first metal layer 52 by using the conductive pillar 531; a pattern of the patterned metal layer structure may be an open closed pattern; and for example, the closed pattern may be a polygon or a circle;

a third dielectric layer 55 that covers a top of the second metal layer 54; and a passivation layer 56 that covers a top of the third dielectric layer 55.

In this embodiment of this application, to reduce a parasitic capacitance between the inductor and a substrate, the first metal layer 52 and the second metal layer 54 are relatively distant from the substrate, and may be two metal layers closest to a top layer of a semiconductor chip, or may be two redistribution layers (RDL layers) in the semiconductor chip. In addition, one of the first metal layer 52 and the second metal layer 54 may be one metal layer closest to the top layer of the semiconductor chip, and the other may be a redistribution layer.

As a specific example, materials of the first metal layer 52 and the second metal layer 54 may be aluminum or aluminum-copper alloys. A thickness of the first metal layer 52 and the second metal layer 54 is related to a semiconductor process.

For example, a forming process of the planar inductor shown in FIG. 5 may include the following steps:

B1: Form the first dielectric layer 51 on the substrate.

B2: Form the first metal layer 52 at the first dielectric layer 51, where the first metal layer 52 is a patterned structure. A pattern of the patterned metal layer structure may be an open closed pattern. For example, the closed pattern may be a polygon or a circle.

B3: Form the second dielectric layer 53 at the first metal layer 52, and further fill a dielectric material that forms the second dielectric layer 53 into a gap of the first metal layer 52.

B4: Etch the second dielectric layer 53, to form, at the second dielectric layer 53, a plurality of through-holes 530 that run through upper and lower surfaces of the second dielectric layer 53.

B5: Form the second metal layer 54 above the second dielectric layer 53, and fill metal forming the second metal layer 54 into the through-holes 530, so that the through-holes 530 form the conductive pillar 531. A pattern of the patterned metal layer structure may be an open closed pattern. For example, the closed pattern may be a polygon or a circle.

B6: Form the third dielectric layer 55 above the second metal layer 54, and fill a dielectric material that forms the third dielectric layer 55 into a gap of the second metal layer 54.

B7: Form the passivation layer 56 above the third dielectric layer 55.

For another example, the forming process of the planar inductor shown in FIG. 5 may include the following steps:

C1: Form the first dielectric layer 51 on the substrate.

C2: Form the first metal layer 52 at the first dielectric layer 51, where the first metal layer 52 is a patterned structure. A pattern of the patterned metal layer structure may be an open closed pattern. For example, the closed pattern may be a polygon or a circle.

C3: Form the second dielectric layer 53 at the first metal layer 52, and further fill a dielectric material that forms the second dielectric layer 53 into a gap of the first metal layer 52.

C4: Etch the second dielectric layer 53, to form, at the second dielectric layer 53, a plurality of through-holes 530 that run through upper and lower surfaces of the second dielectric layer 53.

C5: Fill the through-holes 530 with conductive materials, so that the through-holes 530 form the conductive pillar 531.

C6: Form the second metal layer 54 above the second dielectric layer 53. A pattern of the patterned metal layer structure may be an open closed pattern. For example, the closed pattern may be a polygon or a circle.

C7: Form the third dielectric layer 55 above the second metal layer 54, and fill a dielectric material that forms the third dielectric layer 55 into a gap of the second metal layer 54.

C8: Form the passivation layer 56 above the third dielectric layer 55.

Figure 6:
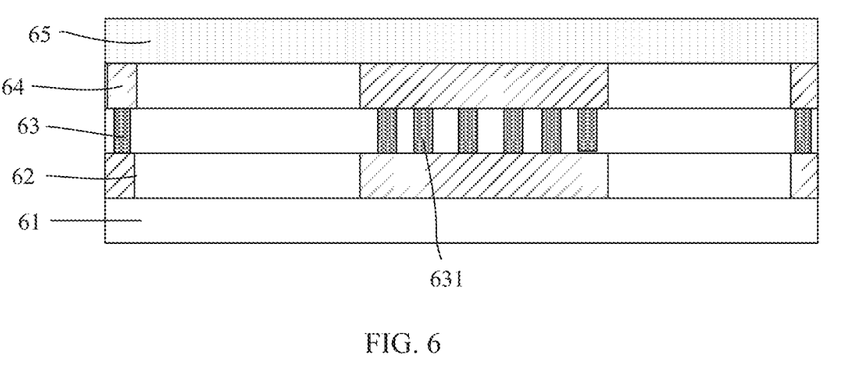
FIG. 6 is a schematic cross-sectional diagram of still another structure of a planar inductor according to an embodiment of this application.

In still another optional implementation of this application, this application further provides another structure of a planar inductor including two metal layers. Specifically, as shown in a cross-sectional structure of FIG. 6, similarly, a cross-sectional structural diagram shown in FIG. 6 is also a cross-sectional view along an I-I direction in FIG. 3. As shown in FIG. 6, the planar inductor includes:

a first dielectric layer 61;

a first metal layer 62 located above the first dielectric layer 61, where the first metal layer 62 is a patterned metal layer structure;

a second dielectric layer 63 that covers the first metal layer 62, where a conductive pillar 631 that runs through upper and lower surfaces of the second dielectric layer 63 is disposed at the second dielectric layer 63;

a second metal layer 64 that covers the second dielectric layer 63, where the second metal layer 64 is a patterned metal layer structure, and the second metal layer 64 is electrically connected to the first metal layer 62 by using the conductive pillar; and a passivation layer 65 that covers a top of the second metal layer 64.

It may be learned through comparison between the cross-sectional structures of the planar inductors shown in FIG. 5 and FIG. 6 that there are many similarities between the two structures; and a difference lies in that in the structure shown in FIG. 5, the third dielectric layer 55 and the passivation layer 56 successively cover the top of the second metal layer, and in the structure shown in FIG. 6, the passivation layer 65 directly covers the top of the second metal layer.

It should be noted that in this embodiment of this application, the planar inductor with a different structure is formed because the semiconductor process used to form the semiconductor chip is different.

In still another optional implementation of this application, a planar inductor may alternatively include three metal layers. A structure of the planar inductor including three metal layers is basically the same as a plane structure including two metal layers. A difference lies only in that one metal layer and a conductive pillar used to implement an electrical connection between metal layers are added. For example, a cross-sectional structure of the planar inductor including three metal layers is shown in FIG. 7.

Figure 7:
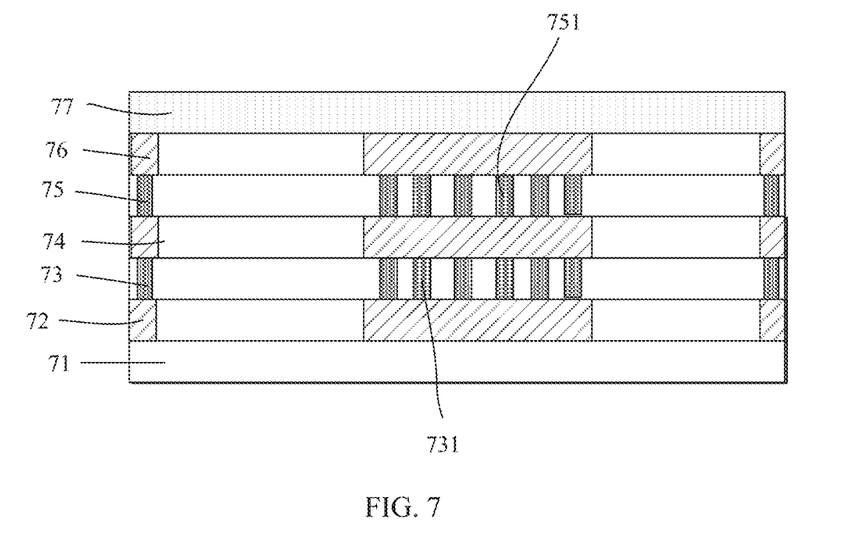
FIG. 7 is a schematic cross-sectional diagram of still another structure of a planar inductor according to an embodiment of this application.

As shown in FIG. 7, the planar inductor including three metal layers includes:

a first dielectric layer 71;

a first metal layer 72 located above the first dielectric layer 71, where the first metal layer 72 is a patterned metal layer structure; a pattern of the patterned metal layer structure may be an open closed pattern; and for example, the closed pattern may be a polygon or a circle;

a second dielectric layer 73 that covers the first metal layer 72, where a conductive pillar 731 that runs through upper and lower surfaces of the second dielectric layer 73 is disposed at the second dielectric layer 73;

a second metal layer 74 that covers the second dielectric layer 73, where the second metal layer 74 is a patterned metal layer structure, and the second metal layer 74 is electrically connected to the first metal layer 72 by using the conductive pillar 731; a pattern of the patterned metal layer structure may be an open closed pattern; and for example, the closed pattern may be a polygon or a circle;

a third dielectric layer 75 that covers a top of the second metal layer 74, where a conductive pillar 751 that runs through upper and lower surfaces of the third dielectric layer 75 is disposed at the third dielectric layer 75;

a third metal layer 76 that covers the third dielectric layer 75, where the third metal layer 76 is a patterned metal layer structure, and the third metal layer 76 is electrically connected to the second metal layer 74 by using the conductive pillar 751; a pattern of the patterned metal layer structure may be an open closed pattern; and for example, the closed pattern may be a polygon or a circle;

a fourth dielectric layer 77 that covers a top of the second metal layer 74; and a passivation layer 78 that covers a top of the fourth dielectric layer 77.

It should be noted that a forming process of the planar inductor including three metal layers is basically the same as the forming process of the planar inductor including two metal layers. A difference lies in that, compared with the forming process of the planar inductor including two metal layers, the forming process of the planar inductor including three metal layers adds a process of forming one metal layer and one dielectric layer.

For brevity, the forming process of the planar inductor including three metal layers is not described in detail in this embodiment of this application.

It should be noted that in the planar inductor provided in this embodiment of this application, when the planar inductor includes a plurality of metal layers, patterns of the metal layers may be the same or different. In addition, in the foregoing example, two adjacent metal layers are electrically connected to each other by using a conductive pillar. In this way, a parasitic resistance between the metal layers can be reduced. In addition, in another example of this application, metal layers may not be electrically connected to each other, and the metal layers are insulated from each other.

The foregoing is an implementation of the planar inductor provided in this embodiment of this application. To better enable magnetic lines in a planar inductor to form a self-close loop, this application further provides another implementation of a planar inductor.

Figure 8:
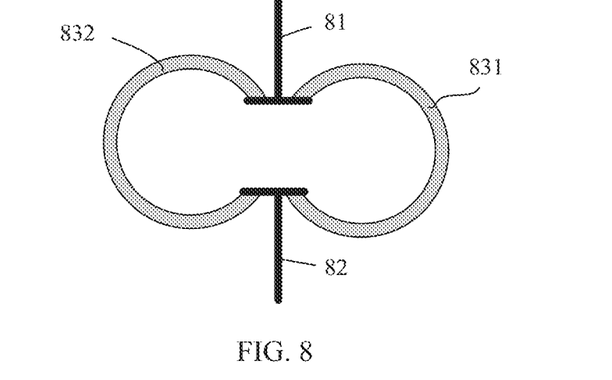
FIG. 8 is a schematic cross-sectional diagram of still yet structure of a planar inductor according to an embodiment of this application.

As shown in FIG. 8, the planar inductor includes a signal input end 81, a signal output end 82, and a pair of metal strips connected in parallel between the signal input end 81 and the signal output end 82. The pair of metal strips includes a first metal strip 831 and a second metal strip 832.

The first metal strip 831 and the second metal strip 832 are distributed on two sides of a connection line between the signal input end 81 and the signal output end 82, a middle segment of the first metal strip 831 protrudes to one side at a center of the connection line between the signal input end 81 and the signal output end 82, and a middle segment of the second metal strip 832 protrudes to the other side at the center of the connection line between the signal input end 81 and the signal output end 82.

It should be noted that in this embodiment of this application, the middle segment of the metal strip refers to any middle position of the metal strip except two ends of the metal strip, instead of merely referring to an exact middle position of the metal strip.

In addition, the first metal strip 831 and the second metal strip 832 may protrude to both sides at the center of the connection line between the signal input end 81 and the signal output end 82, to form a same shape and/or a same size. In this way, impact of a far magnetic field generated by the inductor on the outside, especially a nearby inductor, can be further reduced, thereby further reducing crosstalk between inductors.

In addition, protruded patterns formed by the first metal strip 831 and the second metal strip 832 on both sides at the center of the connection line between the signal input end 81 and the signal output end 82 may be regular patterns, or may be irregular patterns. For example, the regular pattern may be a circle or a polygon. A circle is used as an example in FIG. 8.

For example, the first metal strip 831 or the second metal strip 832 may include at least one metal layer.

To increase an inductance value and a Q value of the inductor, in another example, the first metal strip 831 or the second metal strip 832 may include two or more stacked metal layers. In addition, to reduce a resistance of the inductor, in a more specific example, in the two or more metal layers, every two adjacent metal layers are connected by using a conductive pillar.

In the inductor, middle segments of a pair of metal strips protrude to two sides by using the connection line as a center to form arc shapes. In this way, a direction of a magnetic line of one metal strip in the pair of metal strips is opposite to a direction of a magnetic line of the other metal strip, so that the magnetic lines can form a self-close loop in the planar inductor, and impact of a far magnetic field generated by the inductor on the outside, especially a nearby inductor, can be greatly reduced, thereby reducing crosstalk between the inductors, that is, reducing a phase noise, and increasing a Q value of the inductor.

The foregoing is a specific implementation of the planar inductor provided in this embodiment of this application. Based on the planar inductors provided in the foregoing embodiments, an embodiment of this application further provides a semiconductor chip, where the semiconductor chip includes a substrate and a planar inductor on the substrate, and the planar inductor is the planar inductor described in any one of the foregoing implementations.

The foregoing provides specific implementations of this application. It should be understood that the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. An inductor device, comprising:
a signal input end, a signal output end, a first inductor, and a second inductor,
wherein the inductor device is disposed in a semiconductor chip,
wherein at least one of the first inductor or the second inductor comprises two or more metal layers of the semiconductor chip,
wherein the first inductor and the second inductor are disposed at a metal layer of the two or more metal layers,
wherein cross-sectional shapes of the first inductor and the second inductor at the metal layer are closed patterns each with an opening,
wherein the closed patterns formed by the first inductor and the second inductor are fastened to each other with openings facing each other, and
wherein the first inductor and the second inductor are connected in parallel between the signal input end and the signal output end.

2. The inductor device according to claim 1, wherein the first inductor and the second inductor are distributed on different sides of the signal input end or the signal output end.

3. The inductor device according to claim 2, wherein the first inductor and the second inductor are distributed on two sides of a connection line between the signal input end and the signal output end.

4. The inductor device according to claim 3, the first inductor and the second inductor are symmetrically distributed on the two sides of the connection line between the signal input end and the signal output end.

5. The inductor device according to claim 1,
wherein shapes of the first inductor and the second inductor are the same, or
wherein sizes of the first inductor and the second inductor are the same.

6. The inductor device according to claim 1, wherein at least one of the closed patterns is a quadrilateral, an octagon, or a circle.

7. The inductor device according to claim 1, wherein a cross-sectional shape of the at least one metal layer is a closed pattern with the opening.

8. The inductor device according to claim 1, wherein two adjacent metal layers of the two or more metal layers are electrically connected to each other by using a conductive pillar.

9. The inductor device according to claim 1, wherein the two or more metal layers comprise one or more metal layers closest to a top layer of the semiconductor chip.

10. The inductor device according to claim 7, wherein a material of the metal layer is aluminum or an aluminum-copper alloy.

11. An inductor, comprising:
a signal input end, a signal output end, and a pair of metal strips connected in parallel between the signal input end and the signal output end,
wherein the pair of metal strips are distributed on two sides of a connection line between the signal input end and the signal output end,
wherein at least one metal strip of the pair of metal strips comprises at least one metal layer,
wherein the at least one metal layer is above a first dielectric layer contacting the metal layer and below a second dielectric layer contacting the metal layer, and
wherein the inductor is a planar inductor.

12. The inductor of claim 11, wherein the pair of metal strips protrude to form a same shape or a same size.

13. The inductor device of claim 1,
wherein the closed patterns formed by the first inductor and the second inductor are fastened by a connection line between the signal input end and the signal output end,
wherein the first inductor, the second inductor, and the connection line comprise the two or more metal layers,
wherein first two adjacent portions of the first inductor are electrically connected to each other by a first conductive pillar,
wherein second two adjacent portions of the second inductor are electrically connected to each other by a second conductive pillar, and
wherein two adjacent portions of the connection line are electrically connected to each other by one or more conductive pillars.

14. The inductor of claim 11, wherein a passivation layer is above and contacting the second dielectric layer.

* * * * *

UNITED STATES PATENT AND TRADEMARK OFFICE
CERTIFICATE OF CORRECTION

| | | |
|---|---|---|
| PATENT NO. | : 12,113,095 B2 | |
| APPLICATION NO. | : 17/205805 | |
| DATED | : October 8, 2024 | |
| INVENTOR(S) | : Zou et al. | |

It is certified that error appears in the above-identified patent and that said Letters Patent is hereby corrected as shown below:

In the Claims

In Column 13, in Claim 7, Line 5, after "of the" delete "at least one".

Signed and Sealed this
Twelfth Day of November, 2024

Katherine Kelly Vidal
*Director of the United States Patent and Trademark Office*